(12) United States Patent  
Worledge et al.

(10) Patent No.: US 11,264,559 B2  
(45) Date of Patent: Mar. 1, 2022

(54) MULTILAYERED MAGNETIC FREE LAYER STRUCTURE FOR SPIN-TRANSFER TORQUE (STT) MRAM

(71) Applicant: International Business Machines Corporation, Armonk, NY (US)

(72) Inventors: Daniel Worledge, San Jose, CA (US); Guohan Hu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/262,396

(22) Filed: Jan. 30, 2019

(65) Prior Publication Data  
US 2020/0243749 A1 Jul. 30, 2020

(51) Int. Cl.  
H01L 27/22 (2006.01)  
H01L 43/10 (2006.01)  
H01L 43/02 (2006.01)  
H01L 43/12 (2006.01)

(52) U.S. Cl.  
CPC ............ *H01L 43/02* (2013.01); *H01L 27/222* (2013.01); *H01L 43/10* (2013.01); *H01L 43/12* (2013.01)

(58) Field of Classification Search  
None  
See application file for complete search history.

(56) References Cited

U.S. PATENT DOCUMENTS

| 8,685,547 | B2 | 4/2014 | Bian et al. |
| 9,246,083 | B2 | 1/2016 | Lee et al. |
| 9,276,198 | B2 | 3/2016 | Lim et al. |
| 2013/0242430 | A1 | 9/2013 | Aoyama et al. |
| 2017/0177514 | A1* | 6/2017 | Lee ................. G06F 3/0647 |
| 2018/0076261 | A1 | 3/2018 | Yoshikawa et al. |

FOREIGN PATENT DOCUMENTS

EP 0459413 B1 2/1996

OTHER PUBLICATIONS

K. Yakushiji et al., Ultrathin Co/Pt and Co/Pd superlattice films for MgO-based perpendicular magnetic tunnel junctions, 2010, Appl. Phys. Lett. 97, 232508 (Year: 2010).*

Gimbert et al., First-principles investigation of the magnetic anisotropy and magnetic properties of Co/Ni(111) superlattices, Physical Review B 86, 184407 (Year: 2012).*

(Continued)

*Primary Examiner* — Xiaoming Liu  
(74) *Attorney, Agent, or Firm* — Scully, Scott, Murphy & Presser, P.C.; Daniel P. Morris, Esq.

(57) ABSTRACT

A multilayered magnetic free layer structure is provided that includes a first magnetic free layer and a second magnetic free layer separated by a non-magnetic layer in which the second magnetic free layer is composed of a $M_1/M_2$ superlattice structure or a $M_1/M_2$ multilayer structure, wherein $M_1$ is a first magnetic metal selected from the group consisting of cobalt (Co), iron (Fe) and alloys thereof, and $M_2$ is a second magnetic metal selected from the group consisting of platinum (Pt), palladium (Pd), nickel (Ni), rhodium (Rh), iridium (Jr), rhenium (Re) and alloys thereof.

8 Claims, 1 Drawing Sheet

(56) References Cited

OTHER PUBLICATIONS

Yamamoto et al., Scanning tunneling microscope observation and magnetic anisotropy of molecular beam epitaxy-grown Fe/Pt superlattices with (111) and (001) orientations, Journal of Applied Physics 95, 7285 (Year: 2004).*

Dorj Odkhuu, Magnetization reversal of giant perpendicular magnetic anisotropy at the magnetic-phase transition in FeRh films on MgO, Physical Review B 93, 064412 (2016) (Year: 2016).*

Dutta, T., et al., "Exchange coupled CoPt/FePtC media for heat assisted magnetic recording", Applied Physics Letters, Apr. 2018, pp. 142411-1 to 142411-5, 112.

Sun, J.Z., et al., "Spin-current interaction with a monodomain magnetic body: A model study", Physical Review B, Jul. 1, 2000, pp. 570-578, vol. 62, No. 1.

* cited by examiner

MULTILAYERED MAGNETIC FREE LAYER STRUCTURE FOR SPIN-TRANSFER TORQUE (STT) MRAM

BACKGROUND

The present application relates to magnetoresistive random access memory (MRAM). More particularly, the present application relates to a magnetic tunnel junction (MTJ) pillar including a multilayered magnetic free layer structure that can improve the performance of spin-transfer torque (STT) MRAM.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier). One of the two plates (i.e., the magnetic reference or pinned layer) is a permanent magnetic set to a particular polarity; the other plate's (i.e., the magnetic free layer's) magnetization can be changed to store information. Such elements may be referred to as a magnetic tunnel junction (MTJ) pillar.

One type of MRAM that can use such a MTJ pillar is STT MRAM. STT MRAM has the advantages of lower power consumption and better scalability over conventional magnetoresistive random access memory which uses magnetic fields to flip the active elements. In STT MRAM, spin-transfer torque is used to flip (switch) the orientation of the magnetic free layer. Moreover, spin-transfer torque technology has the potential to make possible MRAM devices combining low current requirements and reduced cost; however, the amount of current needed to reorient (i.e., switch) the magnetization is at present too high for most commercial applications.

In the prior art of spin torque switching, the emphasis has been on lowering the magnetic damping (also called Gilbert damping) of the magnetic free layer. The theory suggests that the switching current is directly proportional to the damping; see, for example, J. Z. Sun, Phys. Rev. B 62, 570 (2000). Hence, lower damping makes the free layer switch in lower current, which is desirable since it means a smaller cell transistor can be used.

In the prior art of spin torque switching, the emphasis has also been to increase the perpendicular magnetic anisotropy field, $H_k$, of the magnetic material of each magnetic free layer in order to allow the reduction of the moment of the free layer to enable fast switching while maintaining high activation energy, which provides good data retention. In the single domain model, the activation energy, Eb, is proportional to the product of the anisotropy field and the free layer magnetic moment, m, as in $Eb=\frac{1}{2}mH_k$. Reducing m reduces the number of spins in the free layer and therefore, due to conservation of angular momentum, reduces the time required to switch. Therefore, in order to maintain the required Eb, the prior art requires increasing $H_k$. The magnetic anisotropy field, $H_k$, is the in-plane field required to saturate a perpendicularly magnetized layer in the in-plane-direction.

FIG. 1 illustrates a prior art MTJ pillar that has been developed in order to reduce the current needed to reorient (i.e., switch) the magnetization of the active elements. The prior art MTJ pillar of FIG. 1 includes a multilayered magnetic free layer structure 14 that contains two magnetic free layers (16 and 20) separated by a non-magnetic layer 18. The prior art MTJ pillar of FIG. 1 also includes a magnetic reference (or pinned) layer 10, and a tunnel barrier layer 12. Element 16 is the first magnetic free layer that forms an interface with the tunnel barrier layer 12, while element 20 is the second magnetic free layer that is separated from the first magnetic free layer 16 by the non-magnetic layer 18. In the drawing, the arrow within the magnetic reference layer 10 shows a possible orientation of that layer and the double headed arrows in the first and second magnetic free layers (16 and 20) illustrate that the orientation in those layers can be switched. The non-magnetic layer 18 is thin enough that the two magnetic free layers (16 and 20) are coupled together magnetically, so that in equilibrium the first and second magnetic free layers 16 and 20 are always parallel. In some cases, and as is shown, in FIG. 1, the second magnetic free layer is present at the top of the MTJ pillar. In other cases, not shown, the MTJ pillar can be formed upside down such that the second magnetic free layer is present at the bottom of the MTJ pillar.

One drawback of the prior art MTJ pillar shown in FIG. 1 is that the switching of the multilayered magnetic free layer structure 14 can be too slow in comparison to the length of the applied voltage pulse. This 'drag' in switching of the orientation of the multilayered magnetic free layer structure 14 of the prior art MTJ pillar of FIG. 1 may result in a write error.

There is thus a need for providing MTJ pillars for use in STT MRAM technology which include an improved multilayered magnetic free layer structure that substantially reduces the switching current needed to reorient the magnetization of the multilayered magnetic free layer, while improving the switching speed and even reducing write errors of the STT MRAM.

SUMMARY

A multilayered magnetic free layer structure is provided that includes a first magnetic free layer and a second magnetic free layer separated by a non-magnetic layer in which the second magnetic free layer is composed of a $M_1/M_2$ superlattice structure or a $M_1/M_2$ multilayer structure, wherein $M_1$ is a first magnetic metal selected from the group consisting of cobalt (Co), iron (Fe) and alloys thereof, and $M_2$ is a second magnetic metal selected from the group consisting of platinum (Pt), palladium (Pd), nickel (Ni), rhodium (Rh), iridium (Jr), rhenium (Re) and alloys thereof. The presence of the $M_1/M_2$ superlattice structure or the $M_1/M_2$ multilayer structure in the multilayered magnetic free layer structure reduces the switching current needed to reorient the magnetization of the two magnetic free layers. The reduction in the switching can improve the switching speed of the second magnetic free layer and thus reduce, and even eliminate, write errors.

In one aspect of the present application, a magnetic tunnel junction (MTJ) pillar for use in spin-transfer torque magnetic random access memory (STT MRAM) is provided. In one embodiment, the MTJ pillar includes a multilayered magnetic free layer structure including a first magnetic free layer and a second magnetic free layer separated by a non-magnetic layer, wherein the second magnetic free layer is composed of a $M_1/M_2$ superlattice structure, wherein $M_1$ is a first magnetic metal selected from the group consisting of cobalt (Co), iron (Fe) and alloys thereof, and $M_2$ is a second magnetic metal selected from the group consisting of platinum (Pt), palladium (Pd), nickel (Ni), rhodium (Rh), iridium (Ir), rhenium (Re) and alloys thereof.

In another embodiment, the MTJ pillar includes a multilayered magnetic free layer structure including a first magnetic free layer and a second magnetic free layer separated by a non-magnetic layer, wherein the second magnetic free layer is composed of a $M_1/M_2$ multilayered structure, wherein $M_1$ is a first magnetic metal selected from the group consisting of cobalt (Co), iron (Fe) and alloys thereof, and $M_2$ is a second magnetic metal selected from the group consisting of platinum (Pt), palladium (Pd), nickel (Ni), rhodium (Rh), iridium (Ir), rhenium (Re) and alloys thereof.

In another aspect of the present application, a method of improving the performance of spin-transfer torque magnetic random access memory is provided. In one embodiment, the method includes providing a magnetic tunnel junction (MTJ) pillar that includes a multilayered magnetic free layer structure including a first magnetic free layer and a second magnetic free layer separated by a non-magnetic layer, wherein the second magnetic free layer is composed of a $M_1/M_2$ superlattice structure or a $M_1/M_2$ multilayered structure, and the second magnetic free layer is formed prior to forming the first magnetic free layer, wherein $M_1$ is a first magnetic metal selected from the group consisting of cobalt (Co), iron (Fe) and alloys thereof, and $M_2$ is a second magnetic metal selected from the group consisting of platinum (Pt), palladium (Pd), nickel (Ni), rhodium (Rh), iridium (Ir), rhenium (Re) and alloys thereof.

DETAILED DESCRIPTION

Figure 1:
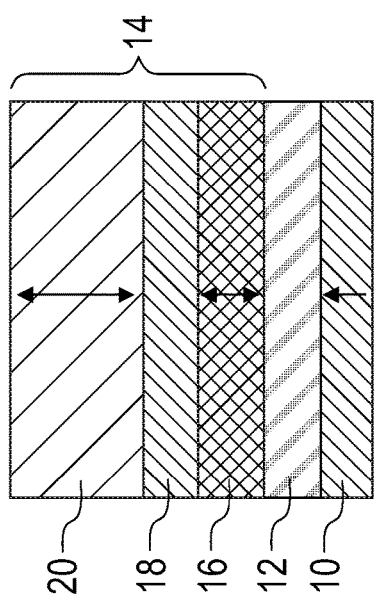
FIG. 1 is a cross sectional view of a prior art MTJ pillar including a multilayered magnetic free layer structure which includes two magnetic free layers separated by a non-magnetic layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 2:
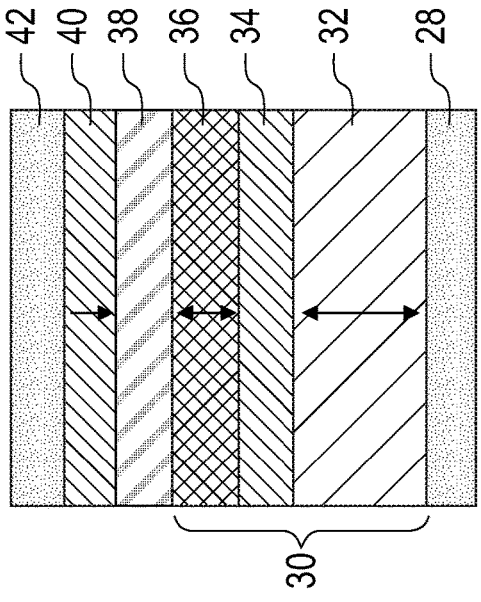
FIG. 2 is a cross sectional view of a MTJ pillar of the present application and including a multilayered magnetic free layer structure which includes two magnetic free layers separated by a non-magnetic layer, in which the second magnetic free layer is composed of a $M_1/M_2$ superlattice structure, wherein $M_1$ is a first magnetic metal selected from the group consisting of cobalt (Co), iron (Fe) and alloys thereof, and $M_2$ is a second magnetic metal selected from the group consisting of platinum (Pt), palladium (Pd), nickel (Ni), rhodium (Rh), iridium (Ir), rhenium (Re) and alloys thereof.

Referring first to FIG. 2, there is illustrated an exemplary MTJ pillar in accordance with one embodiment of the present application. The term "pillar" as used in the present application denotes a multilayered structure that has been formed by deposition and photolithography. The MTJ pillar of FIG. 2 includes a multilayered magnetic free layer structure 30, a tunnel barrier layer 38 and a magnetic reference layer 40. The multilayered magnetic free layer structure 30 includes, from bottom to top, a second magnetic free layer 32, a non-magnetic layer 34 and a first magnetic free layer 36. As is shown, the second magnetic free layer 32 is formed on a surface of a bottom electrode 28, and a top electrode 42 is located above the magnetic reference layer 40.

The bottom electrode 28 is located on a surface of an electrically conductive structure (not shown) that is embedded in a first interconnect dielectric material layer (also not shown). In some embodiments, an MTJ cap (not shown) can be positioned between the magnetic reference layer 40 and the top electrode 42. The MTJ pillar of FIG. 2, together with the MTJ cap and the top electrode 42 can be embedded within a second interconnect dielectric material layer (also not shown). The bottom electrode 28 may be composed of an electrically conductive material and can be formed utilizing techniques well known to those skilled in the art.

In the embodiment illustrated in FIG. 2, the second magnetic free layer 32, which is formed on a surface of bottom electrode 28, is composed of a $M_1/M_2$ superlattice structure, wherein $M_1$ is a first magnetic metal selected from the group consisting of cobalt (Co), iron (Fe) and alloys thereof, and $M_2$ is a second magnetic metal selected from the group consisting of platinum (Pt), palladium (Pd), nickel (Ni), rhodium (Rh), iridium (Jr), rhenium (Re) and alloys thereof. In one example, $M_1$ is cobalt (Co) and $M_2$ is platinum (Pt). The term "$M_1/M_2$ superlattice structure" is used throughout this application to denote a structure that consists of alternating monolayers of $M_1$ and $M_2$. The term "monolayer" denotes a single continuous layer of film that is one molecule or atom in thickness. In the present application, each monolayer of $M_1$ and $M_2$ within the $M_1/M_2$ superlattice structure has a thickness of about 0.2 nm (the term "about" denotes that a given value may varying from ±10% of the given value). The number of alternating monolayers of $M_1$ and $M_2$ that are present in the $M_1/M_2$ superlattice structure may vary so long as at least one monolayer of $M_1$ and at least one monolayer of $M_2$ are present. In one example, the $M_1/M_2$ superlattice structure may include from 5 monolayers to 10 monolayers of $M_1$ and $M_2$.

The second magnetic free layer 32 composed of the $M_1/M_2$ superlattice structure is typically formed on a thin (about 2 nm thick) metal seed layer (not shown in the drawings). The metal seed layer can be composed of platinum (Pt), palladium (Pd), nickel (Ni), rhodium (Rh), iridium (Jr), rhenium (Re) or alloys and multilayers thereof. In one example, the metal seed layer is composed of platinum (Pt). The metal seed layer can be formed by sputtering, atomic layer deposition (ALD), chemical vapor deposition (CVD) or physical vapor deposition (PVD). The second magnetic free layer 32 composed of the $M_1/M_2$ superlattice structure can be formed utilizing a deposition process such as, for example, chemical vapor deposition (CVD), plasma enhanced chemical vapor deposition (PECVD), physical vapor deposition (PVD), or sputtering.

The second magnetic free layer 32 composed of the $M_1/M_2$ superlattice structure has a second perpendicular magnetic anisotropy field which is typically from 1 kOe to 10 kOe. The second magnetic free layer 32 composed of the $M_1/M_2$ superlattice structure has a second thickness. In one embodiment, the second thickness of the second magnetic free layer 32 composed of the $M_1/M_2$ superlattice structure is from 0.4 nm to 4 nm. The second magnetic free layer 32 composed of the $M_1/M_2$ superlattice structure has a FCC 111 texture.

The non-magnetic layer 34 of the multilayered magnetic free layer structure 30 is composed of a non-magnetic material that contains at least one element with an atomic number less than 74 such as, for example, beryllium (Be), magnesium (Mg), aluminum (Al), calcium (Ca), boron (B), carbon (C), silicon (Si), vanadium (V), chromium (Cr), titanium (Ti), manganese (Mn) or any combination including alloys thereof. The thickness of the non-magnetic layer 34 is thin enough to allow the first and second magnetic free layers (36, 32) to couple together magnetically so that in equilibrium layers 36 and 32 are always parallel. In one example, the non-magnetic layer 34 has a thickness from 0.3 nm to 3.0 nm. The non-magnetic layer 34 can be formed by utilizing a deposition process such as, for example, chemical vapor deposition (CVD), plasma enhanced chemical vapor deposition (PECVD), physical vapor deposition (PVD), or sputtering.

In some embodiments, and in order to have a smooth structural transition from a second magnetic free layer 32 having a FCC 111 texture to a first magnetic free layer 36 having a BCC 001 texture, the non-magnetic layer 34 is an amorphous non-magnetic material. The term "amorphous" denotes that the non-magnetic material lacks any long range crystalline structure, i.e., they are not crystalline. Exemplary amorphous non-magnetic materials that can be used as the non-magnetic spacer include, but are not limited to, AlN, AlB, AlC, MgB, and/or MgC. The amorphous non-magnetic material may be formed by utilizing a deposition process such as, for example, chemical vapor deposition (CVD), plasma enhanced chemical vapor deposition (PECVD), physical vapor deposition (PVD), or sputtering.

The first magnetic free layer 36 of the multilayered magnetic free layer structure 30 of the present application, which is formed on the non-magnetic layer 34, is composed of a magnetic material (i.e., a first magnetic material) or a stacked of magnetic materials (i.e., a first magnetic material stack) with a magnetization that can be changed in orientation relative to the magnetization orientation of the magnetic reference layer 40. Exemplary materials for the first magnetic free layer 36 include alloys and/or multilayers of cobalt (Co), iron (Fe), alloys of cobalt-iron, nickel (Ni), alloys of nickel-iron, and alloys of cobalt-iron-boron. The first magnetic free layer 36 can be formed by utilizing a deposition process such as, for example, chemical vapor deposition (CVD), plasma enhanced chemical vapor deposition (PECVD), physical vapor deposition (PVD), or sputtering.

The first magnetic free layer 36 has a first perpendicular magnetic anisotropy field, which differs from the second perpendicular magnetic anisotropy field of the second magnetic free 32 composed of the $M_1/M_2$ superlattice structure. In one embodiment, the first perpendicular magnetic anisotropy field of the first magnetic free layer 36 is from 2 kOe to 20 kOe. The first magnetic free layer 36 has a first thickness. In one embodiment, the first thickness of the first magnetic free layer 36 is from 0.8 nm to 1.5 nm. In some embodiments, and in order to have a high magnetoresistance with the tunnel barrier layer 38, the first magnetic free layer has a BCC 001 texture.

Tunnel barrier layer 38, which is formed on a surface of the first magnetic reference layer 36, is composed of an insulator material and is formed at such a thickness as to provide an appropriate tunneling resistance. Exemplary materials for the tunnel barrier layer 38 include magnesium oxide, aluminum oxide, and titanium oxide, or their combinations, or materials of higher electrical tunnel conductance, such as semiconductors or low-bandgap insulators. The thickness of the tunnel barrier layer 38 will depend on the material selected. In one example, the tunnel barrier layer 38 may have a thickness from 0.5 nm to 1.5 nm. The tunnel barrier layer 32 can be formed by utilizing a deposition process such as, for example, chemical vapor deposition (CVD), plasma enhanced chemical vapor deposition (PECVD), physical vapor deposition (PVD), or sputtering.

The magnetic reference layer 40, which is formed on the tunnel barrier layer 38, has a fixed magnetization. The magnetic reference layer 40 may be composed of a metal or metal alloy that includes one or more metals exhibiting high spin polarization. In alternative embodiments, exemplary metals for the formation of magnetic reference layer 40 include iron, nickel, cobalt, chromium, boron, and manganese. Exemplary metal alloys may include the metals exemplified by the above. In another embodiment, the magnetic reference layer 40 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed, and some layers within the magnetic reference layer 40 may be coupled antiparallel to each other in order to reduce the dipole fringing field on the free layer. The thickness of magnetic reference layer 40 will depend on the material selected. In one example, magnetic reference layer 40 may have a thickness from 0.3 nm to 3 nm. The magnetic reference layer 40 can be formed by utilizing a deposition process such as, for example, chemical vapor deposition (CVD), plasma enhanced chemical vapor deposition (PECVD), physical vapor deposition (PVD), or sputtering.

In some embodiments (not shown), a MTJ cap layer can be formed on a physically exposed surface of the magnetic reference layer 40. When present, the MTJ cap may be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer may be formed utilizing a deposition process including, for example, CVD, PECVD, ALD, PVD, sputtering, chemical solution deposition or plating. The MTJ cap layer may have a thickness from 2 nm to 25 nm; other thicknesses are possible and can be used in the present application as the thickness of the MTJ cap layer.

The top electrode 42 may include any electrically conductive metal or metal alloy. In one embodiment, the top electrode 42 is composed of a same electrically conductive material as the bottom electrode 28. In another embodiment, the top electrode 42 may be composed of a compositionally different electrically conductive material than the bottom electrode 28. The top electrode 42 may be formed utilizing techniques well known to those skilled in the art. The top electrode 42 is typically formed within an opening that is provided to an interconnect dielectric material layer that is formed laterally adjacent and atop the MTJ pillar of FIG. 2.

Figure 3:
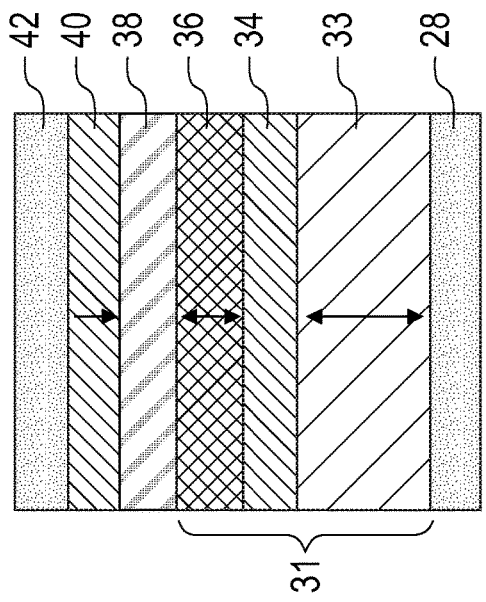
FIG. 3 is a cross sectional view of a MTJ pillar of the present application and including a multilayered magnetic free layer structure which includes two magnetic free layers separated by a non-magnetic layer, in which the second magnetic free layer is composed of a $M_1/M_2$ multilayered structure, wherein $M_1$ is a first magnetic metal selected from the group consisting of cobalt (Co), iron (Fe) and alloys thereof, and $M_2$ is a second magnetic metal selected from the group consisting of platinum (Pt), palladium (Pd), nickel (Ni), rhodium (Rh), iridium (Ir), rhenium (Re) and alloys thereof.

Referring now to FIG. 3, there is illustrated an exemplary MTJ pillar in accordance with another embodiment of the present application. The MTJ pillar of FIG. 3 includes a multilayered magnetic free layer structure 31, a tunnel barrier layer 38 and a magnetic reference layer 40. The multilayered magnetic free layer structure 31 includes, from bottom to top, a second magnetic free layer 33, a non-magnetic layer 34 and a first magnetic free layer 36. As is shown, the second magnetic free layer 33 is formed on a surface of a bottom electrode 28, and a top electrode 42 is located above the magnetic reference layer 40.

In this embodiment, the bottom electrode 28, the non-magnetic layer 34, the first magnetic free layer 36, the tunnel barrier layer 38, the magnetic reference layer 40, and the top electrode 42 are the same as mentioned above for the exemplary structure shown in FIG. 2. A MTJ cap, as defined above, may also be formed between the magnetic reference layer 40 and the top electrode 42.

In this embodiment, the second magnetic free layer 33 of the multilayered magnetic free layer structure 31 is composed of a $M_1/M_2$ multilayered structure, wherein $M_1$ is a first magnetic metal selected from the group consisting of cobalt (Co), iron (Fe) and alloys thereof, and $M_2$ is a second magnetic metal selected from the group consisting of platinum (Pt), palladium (Pd), nickel (Ni), rhodium (Rh), iridium (Jr), rhenium (Re) and alloys thereof. In one example, $M_1$ is cobalt (Co) and $M_2$ is platinum (Pt). In this embodiment, the $M_1/M_2$ multilayered structure that provides the second magnetic free layer 33 consists of alternating layers of $M_1$ and $M_2$ whose thickness is other than a monolayer. The number of alternating layers of $M_1$ and $M_2$ that are present in the $M_1/M_2$ multilayered structure may vary so long as at least one layer of $M_1$ and at least one layer of $M_2$ are present. In one example, the $M_1/M_2$ multilayered structure includes from 5 layers to 10 layers of $M_1$ and $M_2$. The thickness of each of the $M_1$ layers and each of the $M_2$ layers that provide the $M_1/M_2$ multilayered structure may be within a range from 0.2 nm to 2 nm.

The second magnetic free layer 33 composed of the $M_1/M_2$ multilayered structure is typically formed on a thin (about 2 nm thick) metal seed layer (not shown in the drawings). The metal seed layer may include platinum (Pt), palladium (Pd), nickel (Ni), rhodium (Rh), iridium (Jr), rhenium (Re) or alloys and multilayers thereof. In one example, the metal seed layer is composed of platinum (Pt). The metal seed layer can be formed by sputtering, atomic layer deposition (ALD), chemical vapor deposition (CVD) or physical vapor deposition (PVD). The second magnetic free layer 33 composed of the $M_1/M_2$ multilayered structure can be formed utilizing a deposition process such as, for example, chemical vapor deposition (CVD), plasma enhanced chemical vapor deposition (PECVD), physical vapor deposition (PVD), or sputtering.

The second magnetic free layer 33 composed of the $M_1/M_2$ multilayered structure has a second perpendicular magnetic anisotropy field which is typically from 1 kOe to 10 kOe. The second magnetic free layer 33 composed of the $M_1/M_2$ multilayered structure has a second thickness. In one embodiment, the second thickness of the second magnetic free layer 31 composed of the $M_1/M_2$ multilayered structure is from 0.8 nm to 1.5 nm. The second magnetic free layer 31 composed of the $M_1/M_2$ multilayered structure has a FCC 111 texture.

Applicant observes that the use of a second magnetic free layer composed of a $M_1/M_2$ superlattice structure or a $M_1/M_2$ multilayered structure as a bottommost component of a multilayered free layer structure in a MTJ pillar provides improved performance to spin-transfer torque (STT) MRAM. Notably, the use of a second magnetic free layer composed of a $M_1/M_2$ superlattice structure or a $M_1/M_2$ multilayered structure as a bottommost component of a multilayered free layer structure in a MTJ pillar substantially reduces the switching current needed to reorient the magnetization of the multilayered magnetic free layer, while improving the switching speed and even reducing write errors of the STT MRAM.

Moreover, the use of a second magnetic free layer composed of a $M_1/M_2$ superlattice structure or a $M_1/M_2$ multilayered structure as a bottommost component of a multilayered free layer structure in a MTJ pillar substantially improves data retention. In some embodiments, a two times improvement of data retention can be exhibiting by using the MTJ pillars of the present application as compared to prior art MTJ pillars that do not include a second magnetic free layer composed of a $M_1/M_2$ superlattice structure or a $M_1/M_2$ multilayered structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetic tunnel junction pillar for use in spin-transfer torque magnetic random access memory comprising:
    a multilayered magnetic free layer structure comprising a first magnetic free layer and a second magnetic free layer separated by a non-magnetic layer, wherein the second magnetic free layer is composed of a $M_1/M_2$ superlattice structure, wherein $M_1$ is a first magnetic metal selected from the group consisting of cobalt (Co), iron (Fe) and alloys thereof, and $M_2$ is a second magnetic metal selected from the group consisting of iridium (Ir), rhenium (Re) and alloys thereof.

2. The magnetic tunnel junction pillar of claim 1, wherein the second magnetic free layer is present beneath the first magnetic free layer.

3. The magnetic tunnel junction pillar of claim 1, wherein the non-magnetic layer is composed of an amorphous non-magnetic material.

4. The magnetic tunnel junction pillar of claim 1, wherein the first magnetic free layer has a BCC 001 texture, and the second magnetic free has a FCC 111 texture.

5. The magnetic tunnel junction pillar of claim 1, further comprising a tunnel barrier layer located on a surface of the first magnetic free layer opposite a surface of the first magnetic free layer that forms an interface with the non-magnetic layer, and a magnetic reference layer located on a surface of the tunnel barrier layer that is opposite the surface of the tunnel barrier that forms an interface with the first magnetic free layer.

6. The magnetic tunnel junction pillar of claim 5, further comprising a bottom electrode in direct physical contact with a surface of the second magnetic free layer, and a top electrode located above the magnetic reference layer.

7. A magnetic tunnel junction pillar for use in spin-transfer torque magnetic random access memory comprising:
a multilayered magnetic free layer structure comprising a first magnetic free layer and a second magnetic free layer separated by a non-magnetic layer, wherein the second magnetic free layer is composed of a $M_1/M_2$ superlattice structure, wherein $M_1$ is a first magnetic metal selected from the group consisting of iron (Fe) and alloys thereof, and $M_2$ is a second magnetic metal selected from the group consisting of palladium (Pd), nickel (Ni), iridium (Ir), rhenium (Re) and alloys thereof.

8. A magnetic tunnel junction pillar for use in spin-transfer torque magnetic random access memory comprising:
a multilayered magnetic free layer structure comprising a first magnetic free layer and a second magnetic free layer separated by a non-magnetic layer, wherein the second magnetic free layer is composed of a $M_1/M_2$ superlattice structure, wherein $M_1$ is a first magnetic metal selected from the group consisting of cobalt (Co) and alloys thereof, and $M_2$ is a second magnetic metal selected from the group consisting of rhodium (Rh), iridium (Ir), rhenium (Re) and alloys thereof.

* * * * *